United States Patent [19]
Yamamura et al.

[11] Patent Number: 5,844,762
[45] Date of Patent: Dec. 1, 1998

[54] ELECTRONIC CIRCUIT DEVICE HAVING A FUNCTION OF INHIBITING RESONANCE IN POWER WIRING

[75] Inventors: Hideho Yamamura, Yokohama; Masakazu Yamamoto, Hadano; Naoki Maru, Yokohama; Satoshi Muraoka, Fujisawa, all of Japan

[73] Assignee: Hitachi, Ltd., Tokyo, Japan

[21] Appl. No.: 762,691

[22] Filed: Dec. 12, 1996

Related U.S. Application Data

[63] Continuation of Ser. No. 138,063, Oct. 20, 1993, abandoned.

[30] Foreign Application Priority Data

Oct. 20, 1992 [JP] Japan .................................. 4-282054

[51] Int. Cl.⁶ ...................................................... H02H 3/22
[52] U.S. Cl. ............................ 361/111; 361/113; 361/761
[58] Field of Search ............................... 307/105; 361/56, 361/58, 110, 111, 113, 117–119, 728, 736–738, 760–764, 748, 750, 766; 333/12, 143, 165, 167, 168, 172, 175, 176, 181–185, 178

[56] References Cited

U.S. PATENT DOCUMENTS

| | | | |
|---|---|---|---|
| 3,681,612 | 8/1972 | Vogl et al. | 307/105 |
| 3,881,137 | 4/1975 | Thanawala | 307/105 |
| 4,365,284 | 12/1982 | Tanaka | 361/738 |
| 4,372,037 | 2/1983 | Scapple et al. | 361/760 |
| 4,864,484 | 9/1989 | Krueger et al. | 307/105 |
| 4,937,540 | 6/1990 | Carlson et al. | 333/12 |
| 5,208,734 | 5/1993 | Someno | 361/736 |
| 5,388,021 | 2/1995 | Stahl | 361/56 |

OTHER PUBLICATIONS

"An electromagnetic approach for modeling high-performance computer packages", IBM Journal of Research and Development, vol. 34, N. 4, Jul. 1990, pp. 580–600.

*Primary Examiner*—Ronald W. Leja
*Attorney, Agent, or Firm*—Antonelli, Terry, Stout & Kraus, LLP

[57] ABSTRACT

An electronic circuit device having a power wiring resonance inhibition function includes a plurality of electronic circuit elements, and a wiring board having the electronic circuit elements disposed thereon. The wiring board includes a plurality of planar power supply wires for supplying power to the electronic circuit elements. The planar power wires include a pair of planar power supply wires for supplying power to the electronic circuit elements at a predetermined voltage. The electronic circuit device also includes a plurality of damping elements disposed at a plurality of positions on the wiring board. The damping elements are connected between the pair of planar power supply wires at a plurality of positions on the pair of planar power supply wires. The damping elements reduce power supply system impedance and inhibit power wiring system resonance, thereby reducing supply voltage fluctuation caused by the power wiring system resonance and noise caused by the supply voltage fluctuation.

10 Claims, 12 Drawing Sheets

ELECTRONIC CIRCUIT ELEMENT

ELECTRONIC CIRCUIT DEVICE HAVING A FUNCTION OF INHIBITING RESONANCE IN POWER WIRING

This is a continuation of application Ser. No. 08/138,063 filed on Oct. 20, 1993 now abandoned.

BACKGROUND OF THE INVENTION

1. Field of the Invention

This invention relates to an electronic circuit device appropriate for high speed operation and more particularly to an electronic circuit device which inhibits resonance in a power supply in a high frequency band.

2. Description of the Related Art

In recent years, high speed operation of electronic circuit devices has been demanded and research thereon has been carried out. Electronic circuit devices which can operate at high speed would enable the time of processing which formerly took a long time to be shortened drastically, allow processing formerly considered impossible to be performed, and make it possible to execute a large number of tasks with one device instead of multiple devices, thus reducing processing costs, and thereby contributing to development of services, facilities, functions, etc., throughout the world, as well as further stimulation of the industrial world.

If an electronic circuit operates at high speed, the current consumed by the electronic circuit also fluctuates at high speed. For example, a digital circuit, which outputs either a high or low voltage, consumes a different amount of current depending on the output voltage or instantaneously consumes a large current when the output voltage changes. Therefore, it is natural that if the digital circuit operates at high speed, its consumption current also fluctuates at high speed. This problem also occurs in analog circuits.

The supply voltage of an electronic circuit must not substantially change; its consumption current must not fluctuate very much either. If the supply voltage fluctuates greatly, the electronic circuit itself may be unable to maintain normal operation and the output voltage of the electronic circuit may change, making it impossible to provide normal signals. The latter case can be interpreted as noise in output signals. If the noise is large, the circuit may malfunction.

For this reason, the power supply and power wiring system is designed to have a low impedance. It is designed not only to have a low direct current (DC) resistance, but also to have a low impedance with respect to alternating current (AC) or high frequency band signals. The latter is intended particularly for devices having high speed circuitry. If the impedance of the power supply and power wiring system is low, even when the consumption current of the circuit fluctuates, the fluctuation of the supply voltage is small and the noise of the circuit is also small; the electronic circuit can operate normally and therefore the device including its operates normally.

Assume that the impedance of the power supply and power wiring system is Z and that a fluctuation of the circuit's consumption current is $\Delta I$. A supply voltage fluctuation $\Delta V$ is represented by $$\Delta V = Z \Delta I$$

Since a part of this becomes a noise signal, a noise voltage Vn is represented by $$Vn = k\Delta V = kZ\Delta I$$

where k is a coefficient of 0 to 1.

As can be seen from these expressions, if the impedance Z of the power supply and power wiring system, is small, the supply voltage fluctuation $\Delta V$ and noise voltage Vn also become small. Therefore, the electronic circuit and device can operate normally.

Hitherto, various techniques have been used to lessen the impedance of the power supply and power wiring system (which will be hereinafter referred to simply as the power supply system). A technique of using bypass capacitors and a technique of increasing a cross-section of the power wiring are typical techniques.

A bypass capacitor is a capacitor of large capacity connected between two power wires. Power is always supplied on two or more wires, such as 5 V (volts) and ground; the bypass capacitor is connected between the two wires. If three or more wires, such as 5 V, 3 V, and ground, are used, the bypass capacitor is connected between two wires such as the 5-V wire and ground or the 3-V wire and ground in many cases, but is not necessarily provided for all combinations of wires and is often located between ground and other wires.

A capacitor, which by its nature has an impedance which decreases as frequency increases has an effect of reducing the impedance of the power supply system in alternating current or high frequency signal situations. Normally, a power supply unit and an feeder circuit are connected by electric wiring. A power supply system impedance for an alternating current or high frequency situation viewed from the electronic circuit increases because of the inductance of the feeder wiring. Then, when a bypass capacitor is connected near the electronic circuit, the power supply system impedance viewed from the electronic circuit decreases. Particularly, for high speed electronic circuits, the high frequency characteristic of the power supply system impedance must be made good. A bypass capacitor is located very near the electronic circuit for decreasing wiring inductance between the electronic circuit and the bypass capacitor. When a plurality of electronic circuits exist, a bypass capacitor is provided for each electronic circuit or for each group of a small number of electronic circuits. The power supply system impedance reduction technique using bypass capacitors reduces the power supply system impedance for alternating current or high frequency signals as viewed from the electronic circuit, although the impedance of the feeder wiring remains unchanged.

Another power supply system impedance reduction technique is to increase a cross-section of the power wiring in order to reduce power wiring inductance and power supply system impedance. To effectively carry out this technique, the power wiring is often made wide, specifically, in the shape of a plane. For example, with printed circuit boards, etc., a multilayer structure is adopted to provide a power supply layer, and power wiring in this layer is made flat. Often, through holes are required for connecting parts and wires, and the plane of the power supply layer is perforated like a mesh. Generally, since at least one of the power wires is ground, ground is also contained in the power wiring.

If the power wiring is formed like a plane, the inductance of the power wiring in the circuit board and that of the power wiring between the bypass capacitor and electronic circuit can be lowered drastically, enabling reduction of the power supply system impedance for alternating current or high frequency signals.

The two power supply system impedance reduction techniques described above can be used in combination and often are used in combination. These two techniques are compatible with each other for reducing the power supply system impedance.

It is desired that the operation speed of electronic circuit devices is made faster, and the present inventors' efforts have been directed toward greater research and development for high speed operation. As the operation speed of electronic circuit devices becomes faster, supply voltage fluctuation will arise from characteristics of a power supply system or signal noise will be caused by the supply voltage fluctuation. The countermeasures described above are not effective for such supply voltage fluctuation or signal noise. Formerly, their causes were not fully understood and therefore countermeasures effective against them were not clear either.

The present inventors' research has shown that resonance of power wiring is the source of these problems, as described below. In principle, the power wiring system is made up of inductance and capacitance produced by wires, capacitors and capacitance between the wires or their distribution forming a distributed constant; resonance at some frequencies is inevitable. Even if the number of capacitors and the wiring length and form are changed, a resonance phenomenon is not completely eliminated, resulting only in a change of resonance frequency. This is a logical conclusion from circuit theory.

Hitherto, resonance problems have been discussed from various aspects for signal systems, but not for power supply systems. In almost all research, power wiring is not noted, and is taken up only as a topic appendant to research on signal wiring. For example, a detailed research example of signal wiring is given on pages 585 to 600 of IBM Journal of Research and Development, Vol. 34, No. 4 Jul. 1990, wherein power supply and ground wiring in the form of a mesh is described. In the paper, the power and ground wiring is included in simulation targets, but not measured, and phenomena such as resonance are not noted.

As described above, formerly the resonance problem in the power supply system was not noted. The possible reasons why the resonance problem was not noted are difficulty in measuring frequency characteristics of power supply system impedance and low interest in the power wiring compared with the signal wiring.

SUMMARY OF THE INVENTION

Accordingly, it is an object of the invention to provide an electronic circuit device which inhibits impedance and voltage fluctuation caused by power supply system resonance in order to reduce noise.

To this end, damping elements are introduced in a power wiring system to drastically reduce or eliminate resonance phenomena.

According to one embodiment of the invention, there is provided an electronic circuit device having a function of inhibiting resonance of power wiring including:
  a plurality of electronic circuit elements;
  two or more power supply wires for supplying necessary power to the electronic circuit elements; and
  at least one damping element connected between the two wires of any pair of the power supply wires.

The damping element can be a resistor. A DC blocking capacitor can be connected to the damping element in series and the series circuit of the damping element and capacitor can be connected between the two wires.

A plurality of damping elements can be connected, in which case the combined resistance value thereof can be made 5 ohms or less.

The damping element can also be a capacitor whose loss factor is 10% or more.

The electronic circuit device can further include a wiring board on which the electronic circuit elements are located and the plurality of damping elements are located at a plurality of positions on the wiring board. The positions on the wiring board at which the damping elements are located may be distributed substantially uniformly on the wiring board.

The electronic circuit device can further include a wiring board on which the electronic circuit elements and the at least one damping element are located. The wiring board has feeding terminals for connecting feeder wiring from an external power unit. A plurality of damping elements are located on the wiring board, at least some of which are connected near the feeding terminals. One or more bypass capacitors connected between power supply wires can be located together with or independently of the feeding terminals on the wiring board.

According to another embodiment of the invention, there is provided a wiring board including:
  a plurality of insulating layers;
  power supply wiring layers, ground layers, and signal wiring layers, each being disposed on a respective one of the insulating layers; and
  one or more damping elements disposed between any of the power supply wiring layers and the ground layer and connected thereto.

According to a further embodiment of the invention, there is provided a semiconductor integrated circuit device including;
  a semiconductor substrate;
  a wiring layer formed on the substrate; and
  one or more damping elements connected to any power supply wire of the wiring layer.

According to another embodiment of the invention, there is provided an electronic circuit package including:
  a wiring board having connection pins;
  semiconductor integrated circuits mounted on the wiring board; and
  a cap or molding material covering a top of the wiring board, wherein damping elements connected between power supply wires are mounted on the wiring board.

The damping elements in the above embodiments can be resistors with or without DC blocking capacitors, or capacitors with a loss factor of 10% or more.

In the invention, the damping elements connected between two wires of a power wiring system introduce loss to the power wiring system and decrease the Q of a resonance circuit made up of power wires, capacitors, etc. That is, the damping elements are adapted to increase loss and reduce resonance drastically. Specifically, the damping elements are provided by connecting resistors or capacitors with a large loss to the power wiring system. If the introduced loss is sufficiently large, the Q at resonance decreases, and resonance is made small or disappears. More specifically, for example, if Q becomes 1 or less, resonance will be made small enough that it will not be recognized as resonance. Even if Q is about 10, resonance becomes small depending on the situation; an acceptable characteristic can be attained depending on the application.

The effect of the invention is based on knowledge provided by the research of the inventors. The inventors measured and analyzed the characteristics of a power wiring system of an electronic circuit device, and as a result found out that resonance caused noise. Such characteristic analysis is enabled by a new impedance measuring technique developed by the inventors. The impedance measuring technique is described below.

Conventional impedance measuring instruments are LCR meters, impedance analyzers, etc. The LCR meter is used to measure the impedance range of 0.1Ω to about 1MΩ in the frequency range of several Hz to about 30 MHz. The impedance analyzer is used to measure the impedance range of 1Ω to about 1kΩ in the frequency range of about 1 MHz to 1 GHz at most. These measuring instruments have great difficulty in measuring impedance in the range of 0.01Ω to about 1Ω in the frequency range of 10 kHz to 1 GHz as indicated in embodiments described below. The whole aspect of the impedance characteristics as shown in FIGS. 5 to 9 cannot be revealed by standard impedance measuring techniques.

The inventors have developed an impedance measuring technique having a measuring capability in the impedance range of 0.001Ω to about 1Ω in the frequency range of 10 kHz to 1 GHz, for example. The measuring technique consists of a combination of a method called a "resistance dividing method" by the inventors, a network analyzer, and a technique called an "S parameter calibration method" by the authors. The specific configuration is as follows An auxiliary circuit is constructed where an input signal is divided by a provided resistance and the impedance of the substance to be measured to generate an output signal. The input and output voltages are measured and compared by means of the network analyzer. Extremely small impedances of 0.01Ω or less can be measured by the method noting the voltage ratio by the resistance division and the dynamic range of the network analyzer, namely the method has an accurate measuring capability even if the ratio of the input and output voltages is large. The method has an extremely high sensitivity and a large signal measuring capability. Further, measurement can be made in the frequency range of low to high frequencies, specifically 10 kHz to 1 GHz, by taking advantage of the high frequency property of the network analyzer itself, namely, the measuring capability in the range of several Hz to several 10 GHz, and the technique of performing all signal processing with S parameters, which has been developed to make the most of the network analyzer capability. The whole aspect of the impedance characteristics as shown in FIGS. 5 to 9 could not be measured and presence of the resonance phenomena described above could not be discovered before the technique described above was developed by the inventors.

DESCRIPTION OF PREFERRED EMBODIMENTS

Referring now to the accompanying drawings, there are shown embodiments of the invention.

Figure 1:
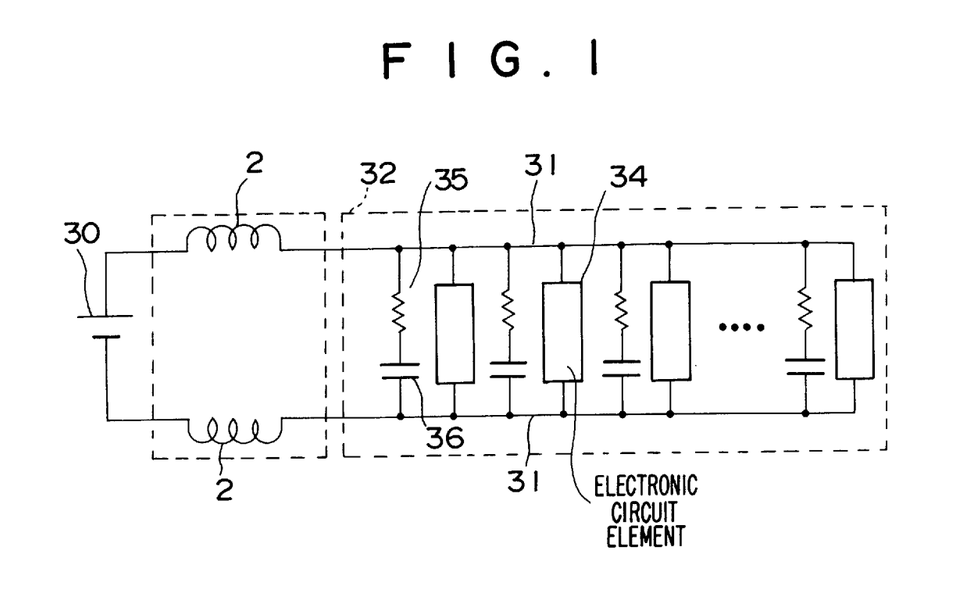
FIG. 1 is a connection circuit diagram showing the configuration of a first embodiment of the invention.
Figure 2:
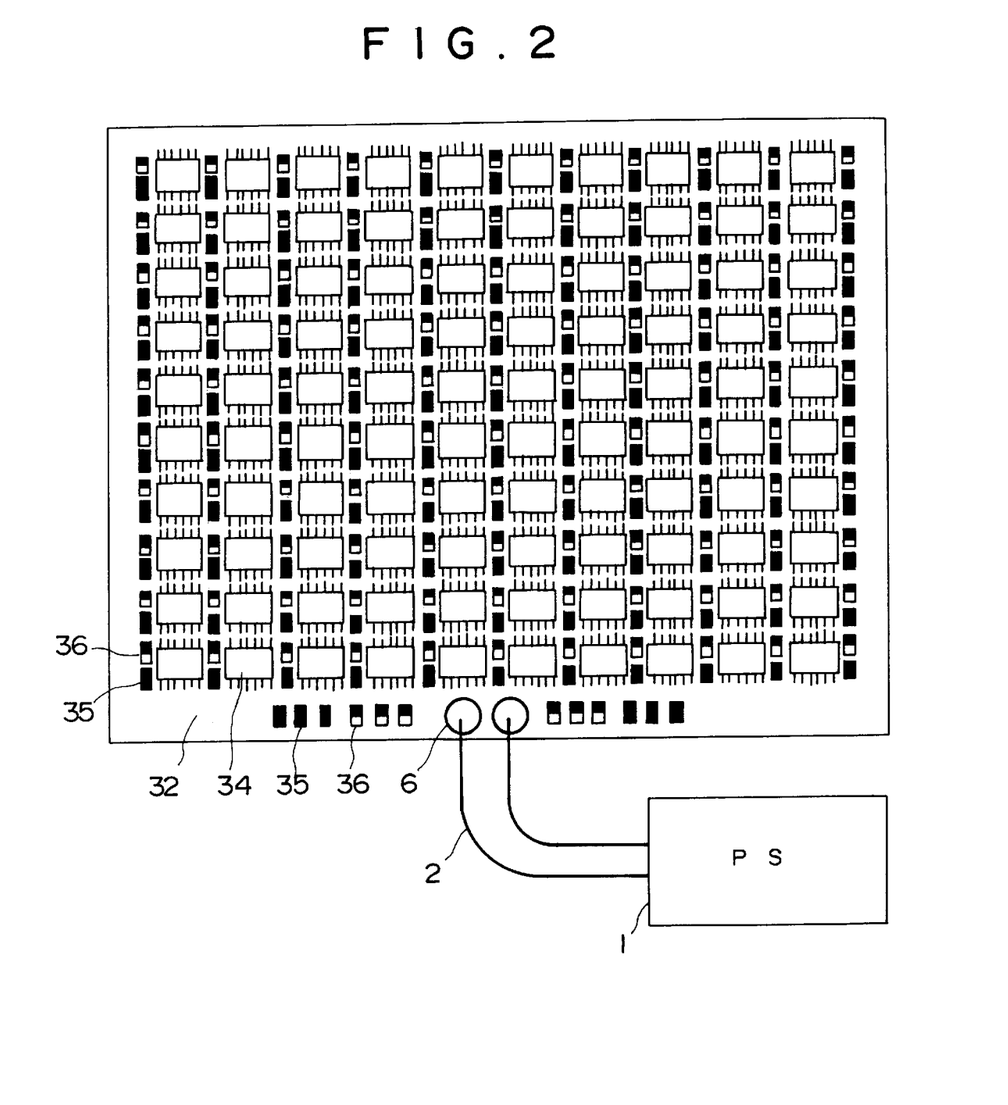
FIG. 2 is a plan view showing the element mounting structure of an electronic circuit device according to the first embodiment of the invention.
Figure 3A:
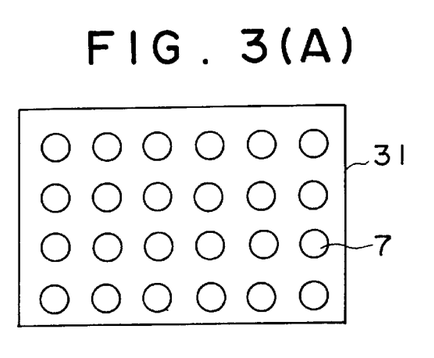
FIGS. 3(A) and 3(B) are plan views showing examples of wide power wiring patterns.
Figure 3B:
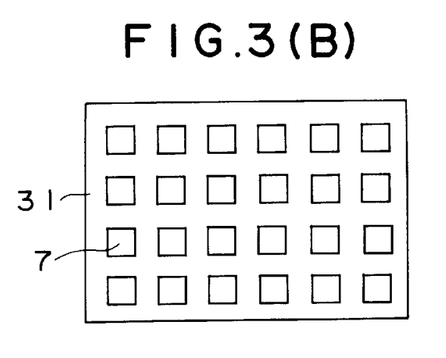
Figure 4:
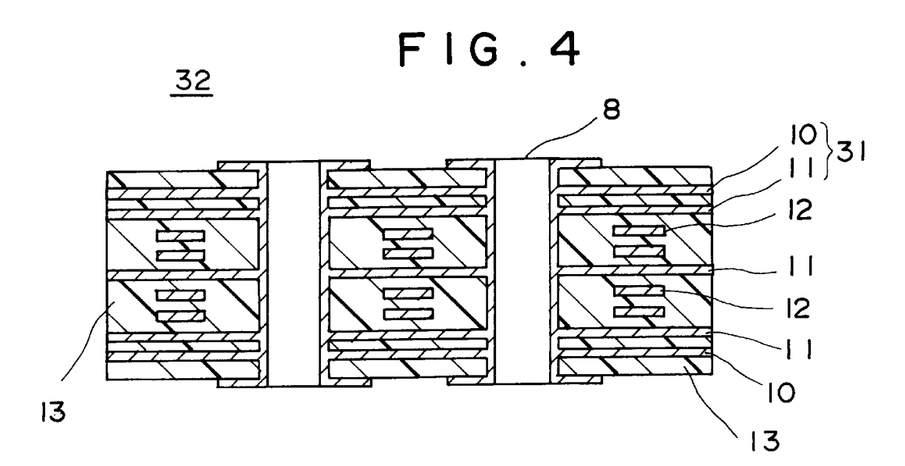
FIG. 4 is a sectional view showing an example of the sectional structure of a printed wiring board in the first embodiment.

FIGS. 1 and 2 show the configuration of a first embodiment of the invention. The first embodiment is an example of an electronic circuit device which has a plurality of electronic circuit elements 34 such as LSIs mounted on a printed wiring board 32. FIG. 1 shows a connection circuit diagram. FIG. 2 shows an element mounting structure drawing of the electronic circuit device. FIGS. 3(A) and 3(B) show examples of power wiring patterns. FIG. 4 shows an example of the sectional structure of the printed wiring board 32.

The printed wiring board 32 is provided with feeding terminals 6, power wiring 31 connected thereto, a signal wiring pattern 12, through holes 8, and pads (not shown) for connecting electronic circuit elements 34 such as semiconductor integrated circuits to the printed wiring board. A power supply unit 1 having a DC power supply 30 is connected via feeder wiring 2 to the feeding terminals 6.

Pairs of DC blocking capacitors 36 and resistors 35 connected in series are connected near the electronic circuit elements 34 between the individual wires of the power wiring 31. The resistors 35 serve as damping elements, as described below. The capacitors 36 are provided to block a flow of DC current through the resistors 35, whereby heating of the resistors 35 can be prevented. In the embodiment, a resistor 35 is provided for each electronic circuit element 34. The electronic circuit elements 34, capacitors 36, and resistors 35 are arranged like a matrix on the printed wiring board 32, as shown in FIG. 2. Of course, an array of the resistors 35 is not limited to that shown in FIG. 2.

The resistor 35 is selected so that its resistance value is sufficiently lower than an impedance at a resonance peak when the resistor 35 is not connected. For example, 5-ohm resistors are used as the resistors 35 and 10-nF (nanofarads) capacitors as the capacitors 36. In the embodiment, a total of 110 pairs of resistors and capacitors connected in series are mounted on the printed wiring board 32. Since the 110 resistor and capacitor series circuits are connected in parallel, to the power wiring 31, the resistors are connected in parallel at high frequencies, and the combined resistance becomes 5/110=0.045Ω, namely ,45 mΩ.

Although the power wiring shown in FIG. 1 has one pair of wires, the embodiment can also be applied to the case in which two or more pairs of wires exist. This also applies to other embodiments described below.

The printed wiring board 32 is a multilayer printed wiring board, and has the sectional structure as shown in FIG. 4, for example. That is, the printed wiring board 32 is made, for example, by forming a power wiring pattern 10 and a ground pattern 11 making up power wiring 31 and a signal wiring pattern 12 on an insulating layer 13 such as glass epoxy resin and laminating them. At this time, the signal wiring pattern 12 is disposed between two ground patterns 11, thereby forming a strip line. The printed wiring board 32 is formed with through holes 8. To make the power wiring pattern 10 and ground pattern 11 as wide as possible while providing through hole openings 7, a mesh structure such as that shown in FIG. 3(A) or FIG. 3(B) can be adopted.

Figure 12:
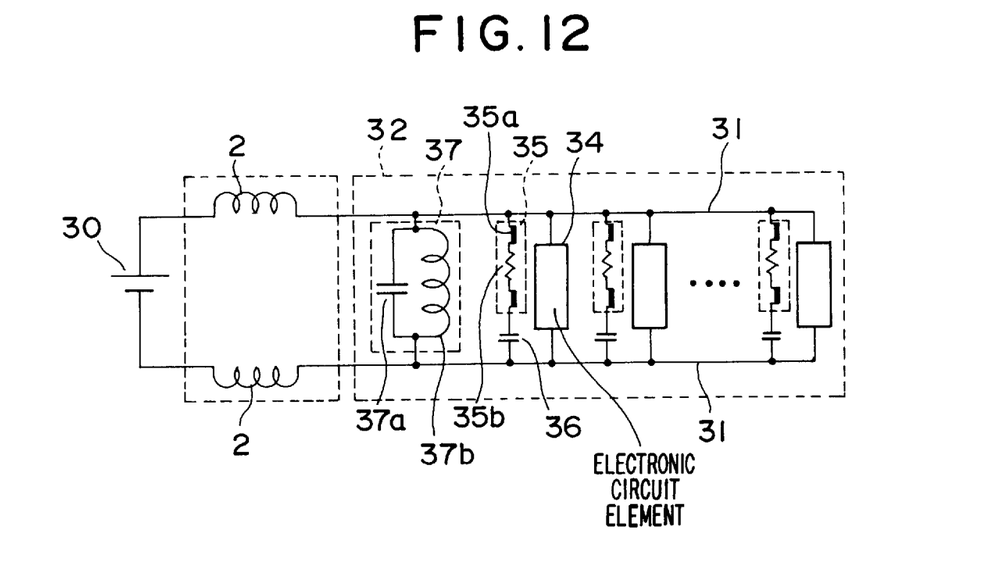
FIG. 12 is a circuit diagram showing an equivalent circuit when resonance is inhibited when the first embodiment operates as a distributed constant type.
Figure 13:
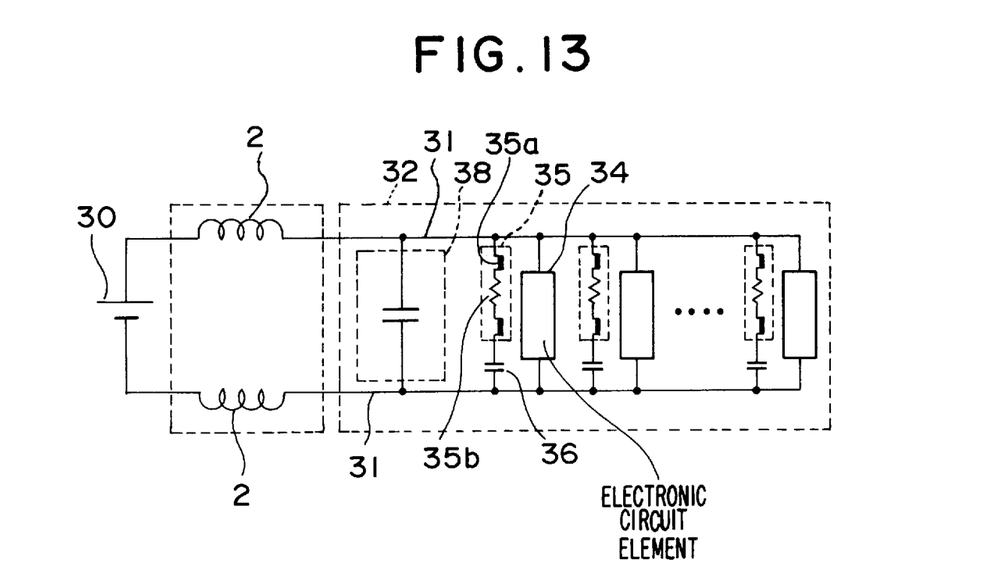
FIG. 13 is a circuit diagram showing an equivalent circuit when resonance is inhibited when the first embodiment operates as a lumped constant type.

In this case, an equivalent circuit of the power wiring system is as shown in FIG. 12 or 13. FIG. 12 shows, for example, an equivalent circuit when resonance is inhibited as a distributed constant type in a high frequency band. In this example, the printed wiring board 32 itself is represented equivalently by a distributed resonance circuit 37 made up of capacitance 37a and inductance 37b. The resistor 35 is represented equivalently by resistance 35b and inductance 35a including lead inductance. FIG. 13 shows, for example, an equivalent circuit when resonance is inhibited as a lumped constant type in a low frequency band. In this example, the printed wiring board 32 itself is represented equivalently by capacitance 38. The resistor 35 is represented equivalently by resistance 35b and inductance 35a including lead inductance.

Figure 18:
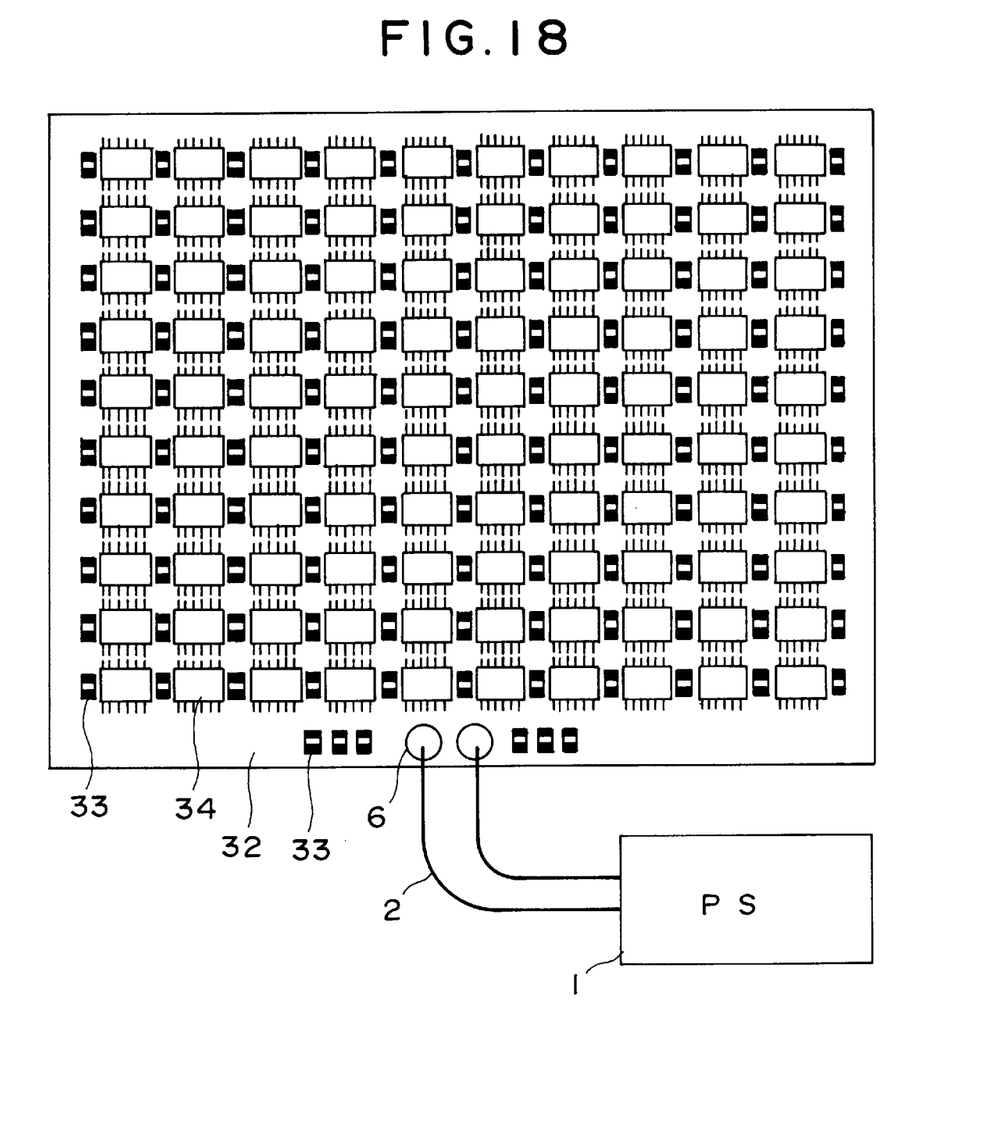
FIG. 18 is a plan view showing the element mounting structure of the electronic circuit device in the comparative example.

FIG. 18 shows an electronic circuit device which is for comparison with the present invention and has the same configuration as the electronic circuit device according to the embodiment in FIG. 2 except that bypass capacitors 33 replace the series circuits of the resistors 35 and capacitors 36. The electronic circuit device in FIG. 18 for comparison and the measurement results of the frequency characteristic therefor will be described. A large number of electronic circuit elements (semiconductor integrated circuits) 34 are mounted on a printed wiring board 32 and a bypass capacitor 33 is connected to each of the electronic circuits 34. Here, the number of bypass capacitors 33 is greater than number of the electronic circuit elements 34. Power is supplied to the printed wiring board 32 by connecting feeder wiring 2 from a power supply unit 1 to feeding terminals 6 disposed on the printed wiring board 32. The bypass capacitors 33 are located near the electronic circuit elements 34 to reduce power supply system impedance by means of the bypass capacitors, as described above.

Figure 17:
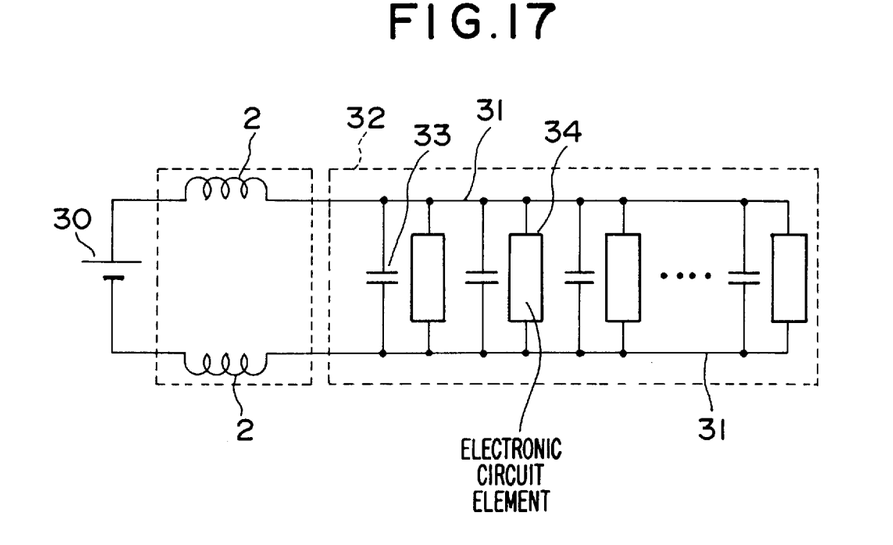
FIG. 17 is a connection circuit diagram showing the configuration of an electronic circuit device in the comparative example.

An equivalent circuit of the power wiring system of the electronic circuit device in FIG. 18 as shown in FIG. 17. Supply voltage is supplied from a DC power supply 30 through feeder wiring 2 and power wiring 31 to the electronic circuit elements 34 on the printed wiring board 32. At this time, since the feeder wiring 2 has inductance, a power supply system impedance at high frequencies viewed from the electronic circuit elements 34 becomes high. However, by connecting a bypass capacitor 33 to each of the electronic circuit elements 34 to prevent wiring inductance from occurring, the power supply system impedance viewed from the electronic circuit elements decrease from DC to high frequencies.

Figure 9:
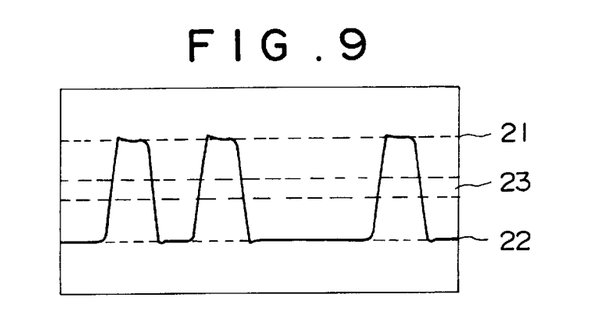
FIG. 9 is a waveform chart showing an example of an expected output waveform of electronic circuit devices in the first embodiment and the comparative example.

The electronic circuit device in FIG. 18 for comparison operates with a 50-MHz (megahertz) clock. An example of the waveform expected as an output waveform of the electronic circuit elements 34 in the device is shown in FIG. 9. The waveform in FIG. 9 indicates that the pluse width, which represents a data rate, is 20 ns (nanoseconds), that output voltage high 21 is 3.6 V, that output voltage low 22 is 0.5 V, and that the range 23 is a dead zone in which the electronic circuit elements do not operate normally.

Figure 10:
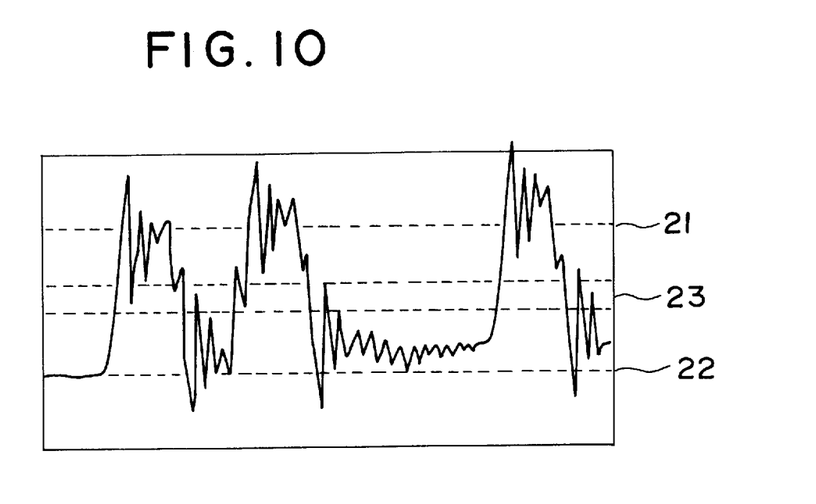
FIG. 10 is a waveform chart showing an output waveform of the electronic circuit device in the comparative example.

The actual output waveform provided by the electronic circuit device shown in FIGS. 17–18 is as shown in FIG. 10, and indicates that the device malfunction. As seen from FIG. 10, a large noise signal appears on the waveform and the dead zone is invaded, causing the device to malfunction. The maximum noise voltage amplitude was 2.7 V. The noise period was about 5 ns, namely, 200 MHz, and noise whose period was 1 μs (microsecond) was also observed. The change of the top and bottom positions between the pulses at the left and right in the figure is a 1-μs period noise error.

Figure 5:
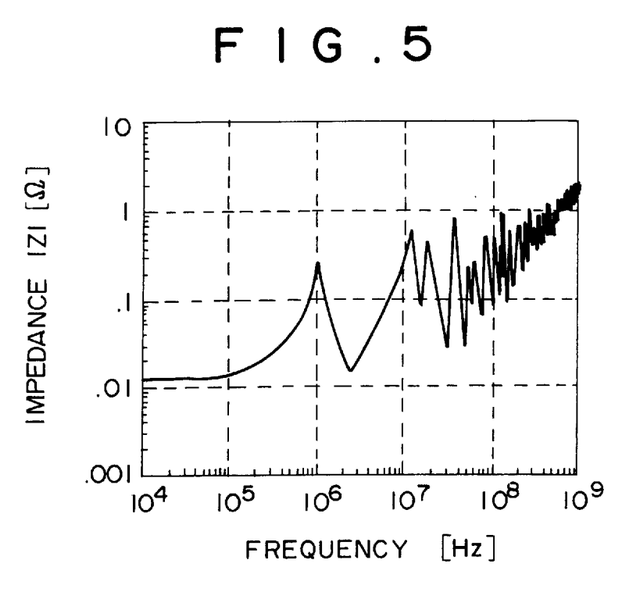
FIG. 5 is a graph showing the frequency characteristic of impedance of a power wiring system in a comparative example where 110 bypass capacitors are used.
Figure 6:
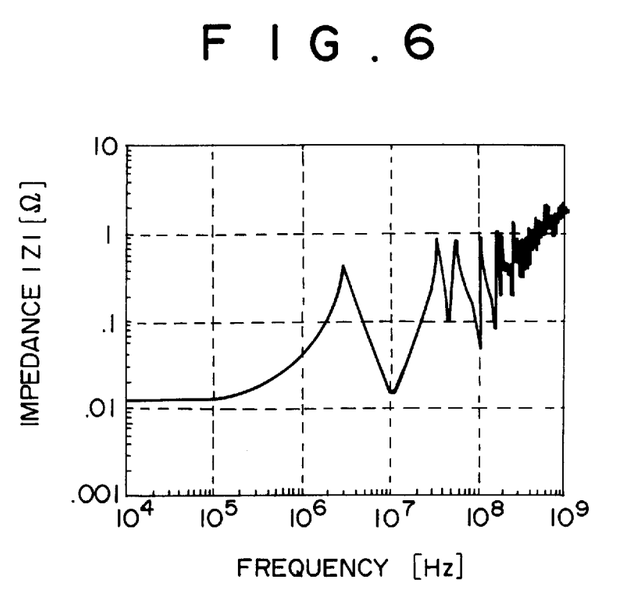
FIG. 6 is a graph showing the frequency characteristic of impedance of the power wiring system in the comparative example where 10 bypass capacitors are used.

Measurement of the frequency characteristic of the impedance of the power supply system of the electronic circuit device in FIGS. 17–18 provided the characteristic shown in FIG. 5. Large resonance peaks can be observed at 200 MHz and 1 MHz. The resonance can be identified as the source of the noise causing the device to malfunction. In addition, large resonance peaks can be observed at frequencies such as 13, 20, and 40 MHz in the power supply system of the device.

To solve this problem, the 110 bypass capacitors 33 in the array in FIG. 18 were reduced to 10 for measurement. The measurement result is the characteristic shown in FIG. 6. Although the resonance frequencies move to higher frequencies, resonance phenomena still appear. Therefore, it can be understood that a drastic countermeasure cannot be provided by changing the number of bypass capacitors. In fact, the malfunction problem was not solved.

Figure 7:
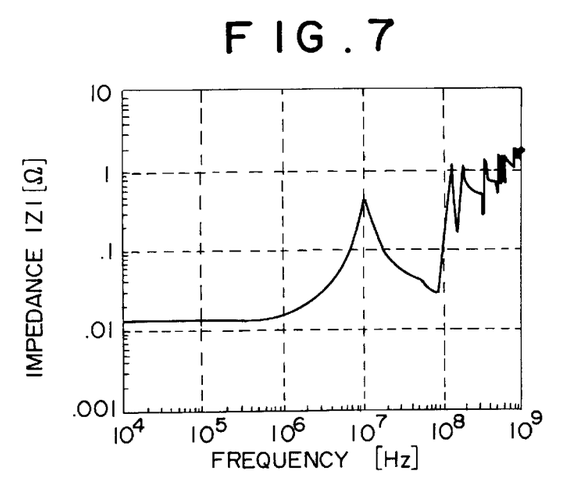
FIG. 7 is a graph showing the frequency characteristic of impedance of the power wiring system in the comparative example where no bypass capacitors are used.

For reference, the measurement result of the characteristic of the device in FIGS. 17–18 with all bypass capacitors 33 removed is shown in FIG. 7. Resonance occurs at 130 MHz, 210 MHz, and its multiples. These frequencies substantially match resonance frequencies calculated from the board dimensions of 450×300 mm and the dielectric constant of a glass epoxy printed wiring board, namely 4.7. It was found that the resonance is caused by the distributed constant nature of the printed wiring board. It was also confirmed that the bypass capacitors server only to change the resonance frequencies.

Figure 8:
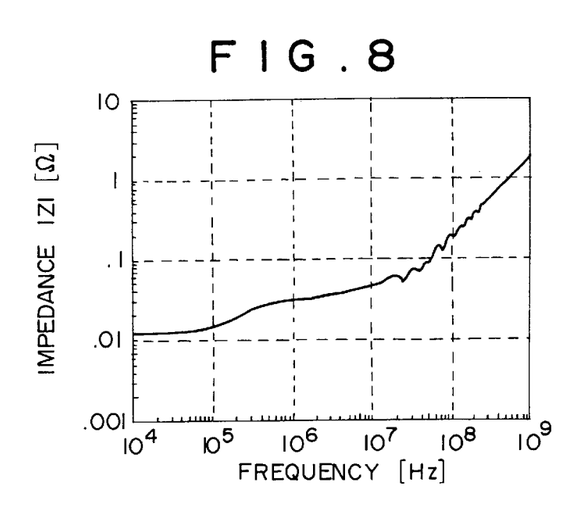
FIG. 8 is a graph showing the frequency characteristic of impedance of a power wiring system in the first embodiment.

In contrast, a similar experiment on the electronic circuit device according to the embodiment in FIG. 2 showed that resonance was inhibited as described below. FIG. 8 shows the frequency characteristic of impedance of the power supply system of the electronic circuit device according to the embodiment in FIG. 2.

As can be seen from FIG. 8 at a glance, resonance phenomena disappear substantially completely. On closer observation, it can be seen that the characteristic rises around 1 MHz and small swells appear around 20 MHz, 40 MHz, and 80 MHz, which are traces of suppressed of resonance from which it is seen that the effect of introducing damping elements is very large. For example, the power supply system impedance which was about 200mΩ at 1 MHz was decreased by a factor of 5 to 40 mΩ. If only the resonance characteristic is noted, the amplitude in the comparison example varied 720 mΩ from 30 mΩ minimum to 750 mΩ maximum in the frequency range of 20–40 MHz, while the extent of impedance fluctuation caused by resonance is decreased by a factor of 42 in the embodiment in FIG. 2, namely it varied 17 mΩ from 54 mΩ minimum to 71 mΩ maximum. Thus, the impedance characteristic of the power wiring system was improved greatly or drastically. At about 30 MHz to 1 GHz, the power wiring impedance rises in proportion to frequency. This is caused by the through holes connected to the pads on the printed wiring board for soldering the power pins of the semiconductor integrated circuits measured. To solve the problem, the through hole length should be shortened, the diameter should be enlarged, the number of through holes should be increased, or the like.

Figure 11:
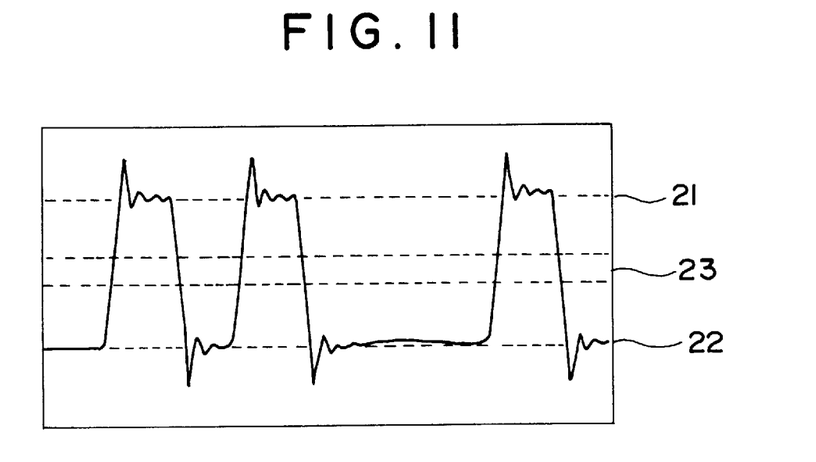
FIG. 11 is a waveform chart showing an output waveform of the electronic circuit device in the first embodiment.

Next, the operation of the electronic circuit device according to the embodiment in FIG. 2 will be described with reference to the waveform chart shown in FIG. 11. As shown in the figure, the large noise found in FIG. 2 disappears and only spikes on the rising and falling edges of the pulses and minute oscillations on flat portions of the pulses remain. The spikes are caused by the through hole inductance and the minute oscillations are is traces of suppressed resonance. The waveform outputs the high and low output voltages 21 and 22 faithfully. Thus, these voltages are far from the dead zone 23 and are provided with sufficient noise margins. The noise voltage amplitude was 1 V containing the spikes or 370 mV containing only the minute oscillation. The spikes appear in directions extending away from the dead zone and do not directly affect the operation of the electronic circuit device. Considering only the minute oscillations, the noise voltage amplitude was 2.7 V in the comparative example in FIGS. 17–18 and 370 mV in the embodiment in FIGS. 1–2 that is, it was reduced by a factor of 7.3 in the embodiment in FIGS. 1–2. The electronic circuit device operated normally.

The high frequency band operation of the electronic circuit device according to the embodiment in FIGS. 1–2 is described in conjunction with the equivalent circuit shown in FIG. 12. The equivalent circuit in FIG. 12 is provided by considering resonance of the printed wiring board 32. A resonance circuit 37 is a portion representing resonance of the printed wiring board 32. Resistors 35 are connected in parallel with the resonance circuit 37 and operate as damping resistances and make the Q of the resonance circuit sufficiently small to inhibit the resonance characteristic. In this case, the printed wiring board 32 is seen as a distributed capacitance 37a and a distributed inductance 37b, and resonance frequencies exist in correspondence to the length and width of the board and their harmonics. Thus, ideally the resistors should be distributed uniformly on the board. At least, some of the resistors should be distributed over the entire board. If the problem resonance mode is known, the resistors can be distributed according to the known characteristic rather than uniformly for optimizing the effect. If the strong inhibition effect is not desired, the resistors may be located by considering limitations on design, etc.

The low frequency band operation of the electronic circuit device according to the embodiment in FIG. 1–2 will be described in conjunction with the equivalent circuit shown in FIG. 13. FIG. 13 is an equivalent circuit where the board is seen as a lumped capacitance 38. In this case, the capacitance 38 and inductance feeder wiring 2 if a DC power supply 30 form a resonance circuit. Since the resonance is of a lumped constant type, no harmonics occur. However, a resonance characteristic having a plurality of more complicated peaks may be present due to complicated wiring. The resonance can also be inhibited by using damping elements such as resistors, etc. In this case, the resonance voltage reaches the maximum value at the connection point of the power wiring and the board, thus ideally some resistors 35 should be connected near the feeding terminals 6 of the board in FIG. 2. If they are spaced 10 cm or less from the feeding terminals 6 and the inductance between the resistors and the feeding terminals is taken into consideration, a good effect may be produced. However, the resonance, the frequencies are also generally low, so the wiring distance is not too important.

The countermeasures for the two resonance modes described above, namely, distributed and lumped constant types, can be made at the same time. For example, as in the embodiment in FIGS. 1–2, the resistors are mounted all over the printed board for inhibition of the distributed constant type resonance, thereby substantially providing sufficient resistors for inhibition of the lumped constant type resonance.

Figure 14:
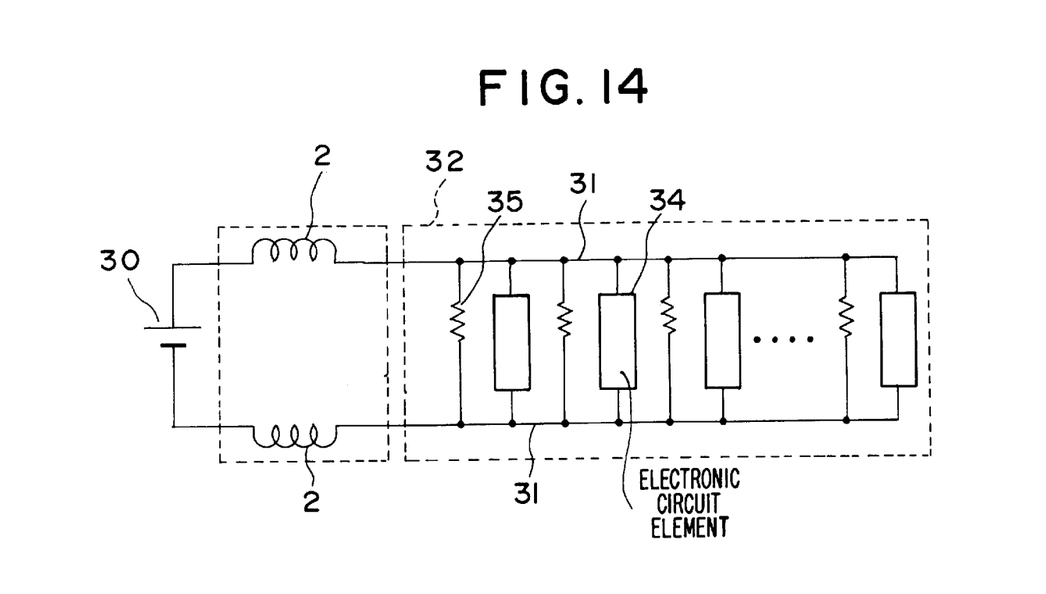
FIG. 14 is a connection circuit diagram showing the configuration of a second embodiment of the invention.

A similar effect of resonance absorption can be produced even if the resistors are not connected to the capacitors in series if circumstances permit. FIG. 14 shows a connection diagram of an electronic circuit device according to a second embodiment of the invention wherein such a connection is made. The configuration of the second embodiment shown in FIG. 14 is the same as that of the first embodiment shown in FIG. 1 except that resistors 35 are connected directly between the individual wires of the power wiring 31, rather than in series with capacitors 36 as in the first embodiment (FIG. 1). The second embodiment has the same resonance inhibition effect as the first embodiment except that DC current flows through the resistors 35.

Since all parts including resistors have inductance because of their dimensions, it is difficult to provide a sufficiently low resistance value by means of one part. Practically, a large number of parts are connected in parallel to provide a sufficiently low resistance value, as shown in FIG. 14. Of course, if a printed resistor or the like is used, one very wide resistor can be designed as a resistor having both a sufficiently low resistance value and inductance. Normally, for the resistance value, a power supply impedance of 5Ω or less is required even with a small circuit; practically the combined resistance value of resistors connected in parallel is made 5Ω or less.

As seen from the equivalent circuits in FIGS. 12 and 13, the series circuit of the resistance 35b, inductance 35a, and capacitor 36 is also an equivalent circuit of a capacitor, and therefore a capacitor can be used in place of a resistor. Considering the operation principle of the invention, a large resistance value is required compared with capacitance, and thus a capacitor having a large loss factor, namely a small Q, would produce the resonance inhibition effect. As a power supply system characteristic, a problem may occur if Q at resonance is 10 or more. Consequently, a capacitor whose Q is 10 or less or whose loss factor is 10% or more is required.

The invention is intended to solve a problem encountered by high speed circuit devices and applies to resonance at high frequencies in a power supply system. However, the problem occurs even at comparatively low frequencies due to the bypass capacitor effect, etc., and the applicants have found that the problem can be efficiently solved by the invention, such that the invention may be applicable to high speed electronic circuit devices whose operation speed is about 1 MHz or more.

As frequencies become high, the number of points resonating due to distributed constant resonance increase. Consequently, of course, the problem will occur more frequently. For example, if bypass capacitors or the resistors and capacitors of the invention are spaced 10 cm apart, distributed constant resonance can occur at a frequency corresponding to that spacing. That frequency is expected to be about 700 MHz for a glass epoxy printed board, for example. Therefore, in a circuit whose operation speed is not sufficiently lower than that frequency, namely is about 35 MHz (1/20 of 700 MHz) or which handles a waveform whose rise time is less than 1 ns, for example, the problem occurs and a layout where the parts are spaced less than 10 cm apart must be adopted. This is one of the reasons for distributing the parts such as resistors and capacitors substantially uniformly in the mounting area.

Of course, the parts can be concentrated in a particular area or only a very few number of resistors can be used as required. For example, a method of mounting the parts only on the periphery of a printed wiring board in many cases whose voltage shows an antinode can be adopted, or a method of mounting the parts only near feeding terminals to inhibit only lumped constant resonance, or a method of mounting a very small number of resistors at independent locations on the printed wiring board corresponding to low frequencies. The particular method which is selected in each case depends on the circuit operation speed, printed wiring board dimensions, etc.

Next, an electronic circuit device according to a third embodiment of the invention will be described.

Figure 15:
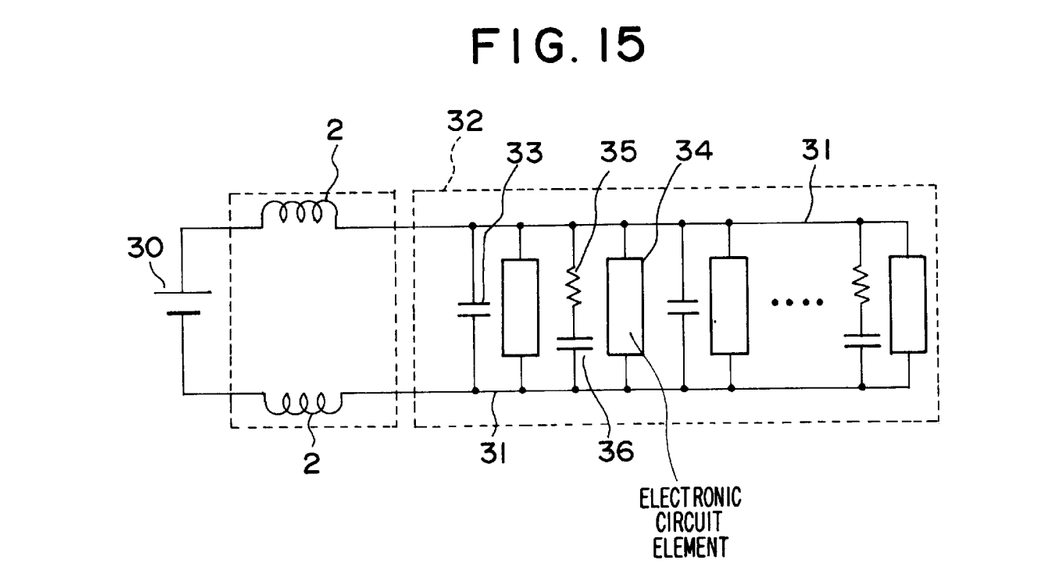
FIG. 15 is a connection circuit diagram showing the configuration of a third embodiment of the invention.
Figure 16:
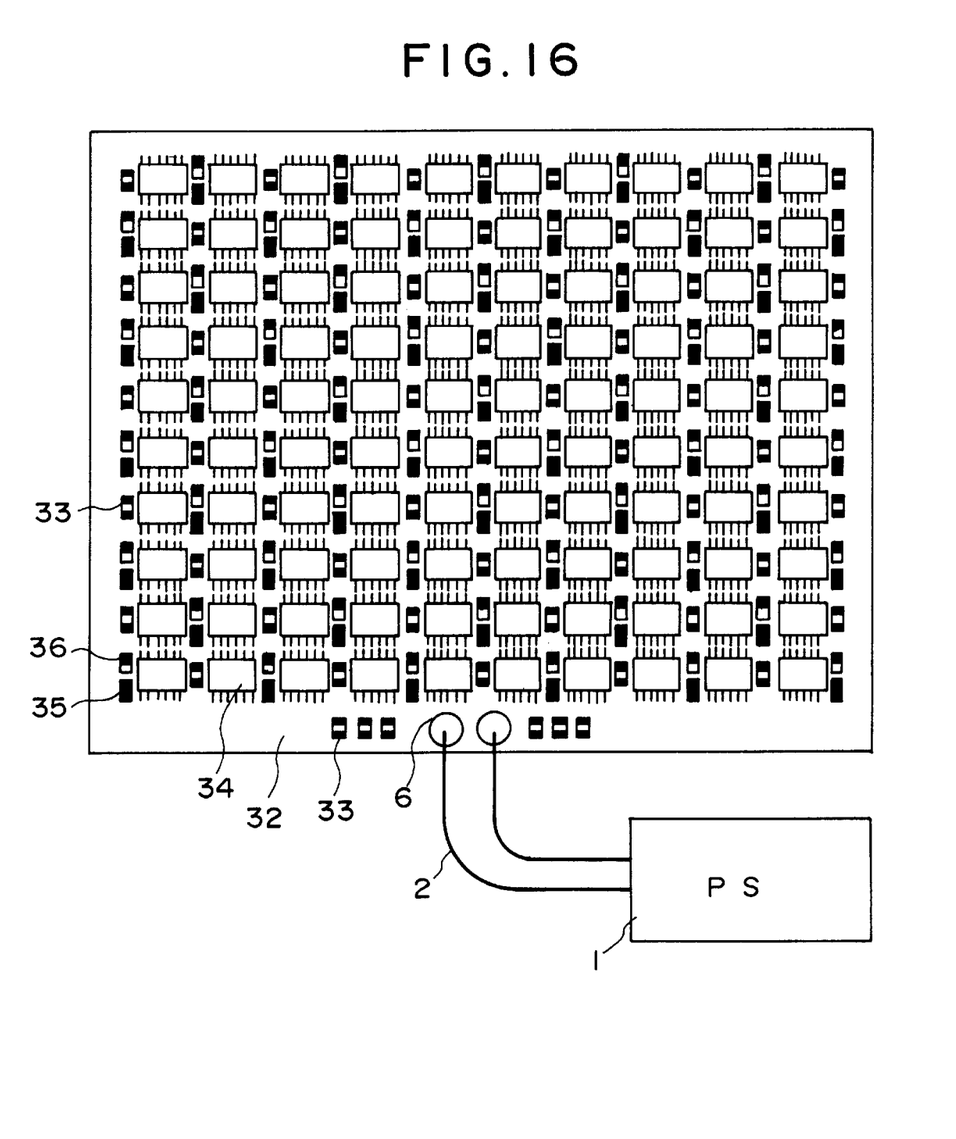
FIG. 16 is a plan view showing the element mounting structure of an electronic circuit device according to the third embodiment of the invention.

This embodiment is an example in which resonance inhibition resistors 35, DC blocking capacitors 36, and bypass capacitors 33 are mixed, as shown in FIG. 15. The element mounting structure thereof is shown in FIG. 16. As shown here, in the third embodiment, the number of mounted resistors 35 is fewer than the number of mounted electronic circuit elements 34. The embodiment can be applied where the resonance inhibition effect is sufficient even if the number of resistors is fewer than that of the electronic circuit elements. In the embodiment, the resistors 35 are not disposed near feeding terminals 6. This example is applied when the resistors 35 located on a printed wiring board 32 are sufficient for resonance inhibition.

In the first to third embodiments, the resistors are mounted on the top of the printed wiring board 32, but the invention is not limited to this layout. For example, either or both of the resistors and capacitors can be disposed within the printed wiring board. In the embodiments, printed wiring boards are used as wiring boards, but the invention can be applied to inhibition of resonance of power wiring for ceramic boards, semiconductor integrated circuit boards, semiconductor integrated circuit packages, etc.

Figure 19:
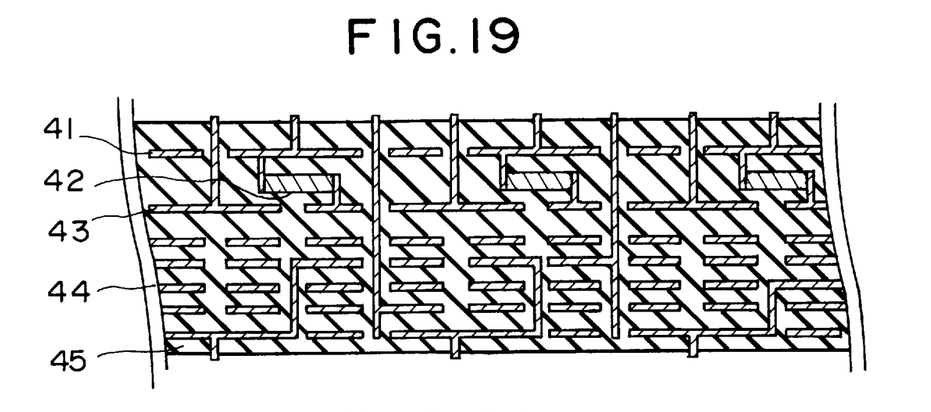
FIG. 19 is a sectional view showing one example of the sectional structure of a ceramic wiring board which is another example of a wiring board to which the invention can be applied.

FIG. 19 shows an example in which resistors are disposed within a wiring board. The example shown in FIG. 19 is a ceramic multilayer wiring board where a power wiring layer 41, a resistance layer 42, a ground layer 43, and a signal wiring layer 44 are formed and laminated and sintered on an insulating layer constituted by a ceramic green sheet.

Of course, this structure can be applied to printed wiring boards as well as ceramic multilayer wiring boards. For example, power wiring layer 41, resistance layer 42, ground layer 43, and signal wiring layer 44 can be formed and laminated on an insulating layer 45 constituted by glass epoxy resin, for example. Here, only resistors are disposed within the wiring board; however, capacitors may also be disposed within the wiring board.

Figure 20:
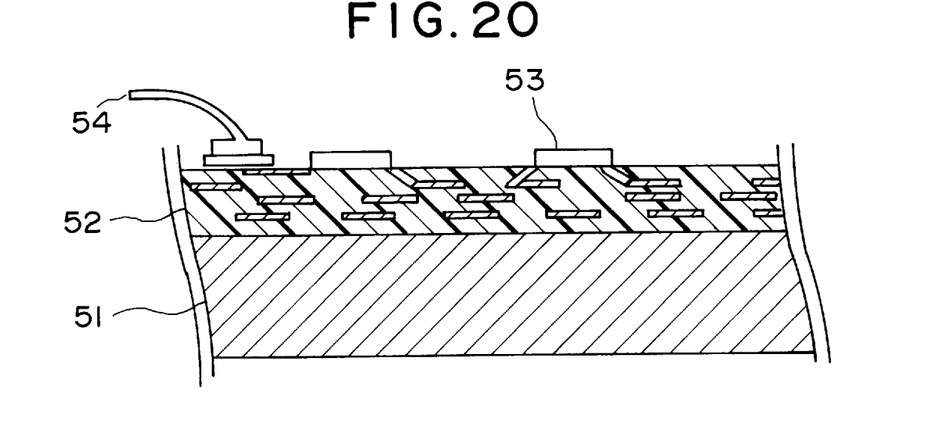
FIG. 20 is a sectional view showing one example of the sectional structure of a semiconductor integrated circuit which is a further example of a wiring board to which the invention can be applied.

FIG. 20 shows an example where resistors are formed on a semiconductor integrated circuit. A wiring layer 52 is disposed on a semiconductor substrate 51 such as silicon (Si) and a resistor 53 and a bonding wire 54 for connection are further disposed on the wiring layer 52. Thus, if the resistor is formed on or within a semiconductor integrated circuit, a wiring board on which the semiconductor integrated circuit is to be mounted can be miniaturized and power wiring impedance can be reduced efficiently. In this example, DC blocking capacitors connected to resistors in series can also be formed on or within the semiconductor integrated circuit.

Figure 21:
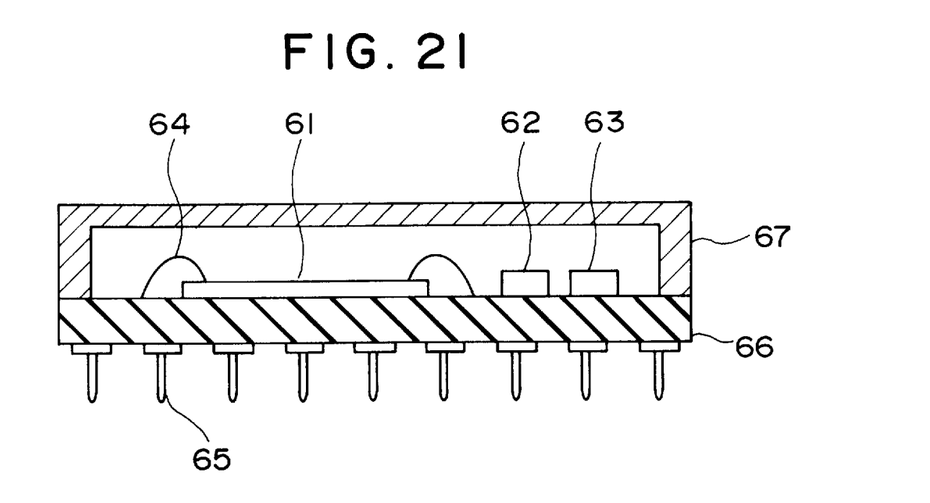
FIG. 21 is a sectional view showing one example of the sectional structure of a semiconductor integrated circuit package which is a further example of a wiring board to which the invention can be applied.

FIG. 21 is an example where resistors are disposed within a semiconductor integrated circuit package. The example includes a ceramic wiring board 66 having pins 65, a cap 67 covering the ceramic wiring board 66 at a predetermined spacing from the ceramic wiring board 66, and a semiconductor integrated circuit (electronic circuit element) 61, a DC blocking capacitor 62, a resistor 63, and a bonding wire 64 for connection mounted on the ceramic wiring board 66. Such a structure eliminates the need for forming a wire to the resistor when designing a wiring board. In this example, both the resistor 63 and the DC blocking capacitor 62 connected to the resistor 63 in series are disposed within the semiconductor integrated circuit package. If circumstances permit, only the resistor may be provided. A bypass capacitor may also be disposed within the semiconductor integrated circuit package.

The examples in FIGS. 20 and 21 have no direct connection of the resistor to the wiring board in common. Since a resistor for inhibiting a resonance phenomenon of a wiring board needs only to be electrically connected to the wiring board, the same effect is apparently produced regardless of whether the resistor is formed within or on a semiconductor integrated circuit or semiconductor integrated circuit package. The mounting locations can vary depending on design, convenience of handling, manufacturing, and business transactions.

Likewise, variations of manufacturing techniques are also possible. For example, carbon film resistors, metal film resistors, thick film resistors, thin film resistors, composite parts of capacitors and resistors, parts with resistance constituted by increasing resistance values of capacitor electrodes, parts with resistance constituted by enlarging dielectric loss of capacitor dielectrics, etc., are only some examples of very small wiring portions of wiring boards in the invention, and thus are contained in the category of the invention.

In the embodiments of the invention, the power supply system impedance can be reduced by a factor of 5, the impedance fluctuation caused by resonance can be reduced by a factor of 42, and the noise voltage amplitude can be reduced by a factor of 7.3.

As described above, according to the invention, power supply system impedance and supply voltage fluctuation caused by power wiring system resonance or noise caused by the fluctuation can be reduced considerably.

What is claimed is:

1. An electronic circuit device having a power wiring resonance inhibition function comprising:

a plurality of electronic circuit elements;

a wiring board having said electronic circuit elements disposed thereon, the wiring board including a plurality of planar power supply wires for supplying power to the electronic circuit elements, the planar power wires including a pair of planar power supply wires for supplying power to the electronic circuit elements at a predetermined voltage; and a plurality of damping elements disposed at a plurality of positions on the wiring board, the damping elements being connected between the pair of planar power supply wires at a plurality of positions on the pair of planar power supply wires.

2. The electronic circuit device having a power wiring resonance inhibition function as claimed in claim 1, wherein the positions on the wiring board at which said damping elements are disposed are distributed substantially uniformly on said wiring board.

3. The electronic circuit device having a power wiring resonance inhibition function as claimed in claim 1, wherein the wiring board further includes feeding terminals for connecting the planar power supply wires to feeders from an external power unit; and wherein at least some of the damping elements are disposed near said feeding terminals.

4. The electronic circuit device having a power wiring resonance inhibition function as claimed in claim 1, further comprising one or more bypass capacitors disposed on the wiring board, the one or more bypass capacitors being connected between the pair of planar power supply wires.

5. A wiring board comprising:

a plurality of insulating layers;

power supply wiring layers, ground layers, and signal wiring layers, each being disposed on a respective one of said insulating layers; and a plurality of damping elements disposed at a plurality of positions between any one of said power supply wiring layers and any one of said ground layers, the damping elements being connected between said one of said power supply wiring layers and said one of said ground layers at said plurality of positions.

6. The wiring board as claimed in claim 5, wherein said damping elements are resistors.

7. An electronic circuit package comprising:

a wiring board having connection pins;

semiconductor integrated circuits mounted on said wiring board; and a cap covering a top of said wiring board;

wherein the wiring board includes:

a plurality of planar power supply wires for supplying power to the semiconductor integrated circuits, the planar power wires including a pair of planar power supply wires for supplying power to the semiconductor integrated circuits at a predetermined voltage; and a plurality of damping elements disposed at a plurality of positions on the wiring board, the damping elements being connected between the pair of planar power supply wires at a plurality of positions on the pair of planar power supply wires.

8. The electronic circuit package as claimed in claim 7, wherein said damping elements are resistors.

9. The electronic circuit package as claimed in claim 8, wherein the wiring board further includes one or more bypass capacitors disposed on the wiring board, the one or more bypass capacitors being connected between the pair of planar power supply wires.

10. An electronic circuit device having a power wiring resonance inhibition function comprising:

a plurality of electronic circuit elements;

a wiring board having said electronic circuit elements disposed thereon; and a plurality of damping elements disposed at a plurality of positions on the wiring board;

wherein the wiring board includes a plurality of planar power supply wires for supplying power to the electronic circuit elements, and feeding terminals for supplying power to the planar power supply wires from an external device;

wherein the damping elements are connected between the planar power supply wires at a plurality of positions on the plurality of planar power supply wires; and wherein said planar power supply wires and said damping elements cooperate to suppress a resonance peak of a power wiring impedance characteristic in a frequency range of $10^4$ Hz to $10^9$ Hz.

* * * * *